United States Patent [19]

Suzuki et al.

[11] 4,103,345
[45] Jul. 25, 1978

[54] SEMICONDUCTOR MEMORY WITH DATA DETECTION CIRCUIT

[75] Inventors: Yasoji Suzuki, Kanagawa; Kiyofumi Ochii, Yokohama, both of Japan

[73] Assignee: Tokyo Shibaura Electric Co., Ltd., Kawasaki, Japan

[21] Appl. No.: 680,236

[22] Filed: Apr. 26, 1976

[30] Foreign Application Priority Data

Apr. 28, 1975 [JP] Japan .................................. 50/50792
Dec. 3, 1975 [JP] Japan ................................ 50/144522

[51] Int. Cl.² ................................................ G11C 7/06
[52] U.S. Cl. .................................... 365/190; 307/238
[58] Field of Search .................... 340/173 R, 173 FF; 307/238, DIG. 3, DIG. 5

[56] References Cited

U.S. PATENT DOCUMENTS

| 3,720,922 | 3/1973 | Kosonocky | 340/173 R |
| 3,778,782 | 12/1973 | Kitagawa | 340/173 R |
| 3,838,295 | 9/1974 | Lindell | 307/238 |
| 3,964,031 | 6/1976 | Eaton, Jr. | 340/173 FF |
| 3,980,899 | 9/1976 | Shimada et al. | 340/173 R |
| 4,045,785 | 8/1977 | Kirkpatrick, Jr. | 340/173 R |

Primary Examiner—Stuart N. Hecker
Assistant Examiner—Donald McElheny
Attorney, Agent, or Firm—Finnegan, Henderson, Farabow & Garrett

[57] ABSTRACT

Provided is a semiconductor memory device comprising a pair of data input lines, a pair of data output lines, memory cells arranged in the form of a matrix, the memory cell of each column being connected between a pair of data lines, the memory cell of each row being connected to a row selection line, a memory cell selection circuit for generating column and row designation signals in order to select a desired one of said memory cells, a switching circuit disposed in each column and turned on upon receipt of a column designation signal from the memory cell selection circuit to connect the data line to a corresponding one of the data input lines, and a data detection circuit connected between the pair of data lines of each column and adapted, upon receipt of a column signal from the memory cell selection circuit, to transmit an inverted signal of a signal on the data line onto the data output line.

12 Claims, 7 Drawing Figures

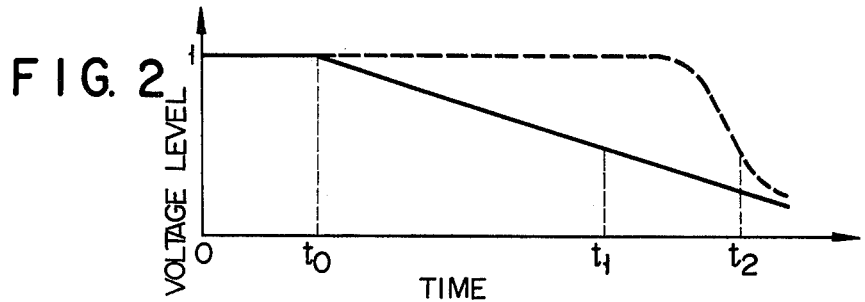
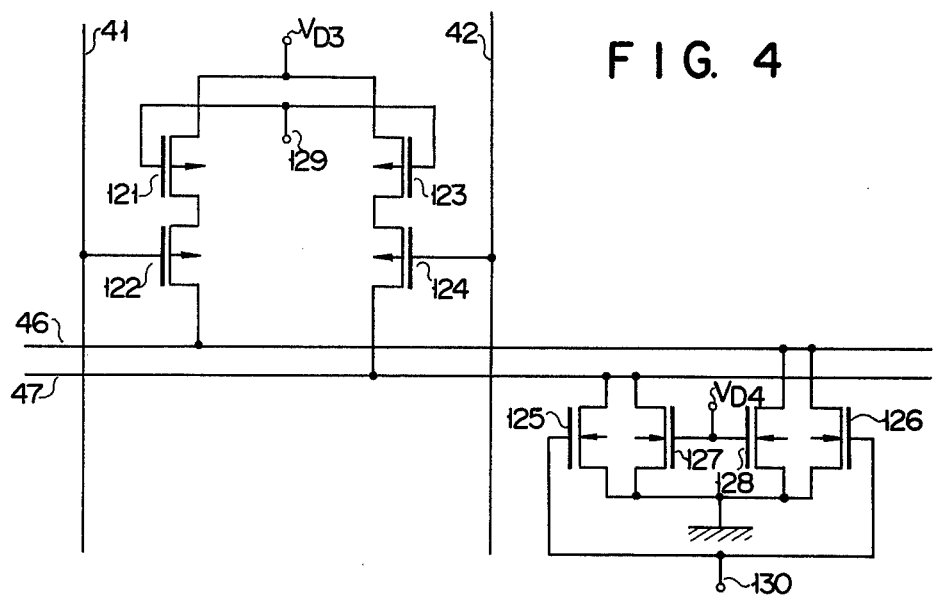
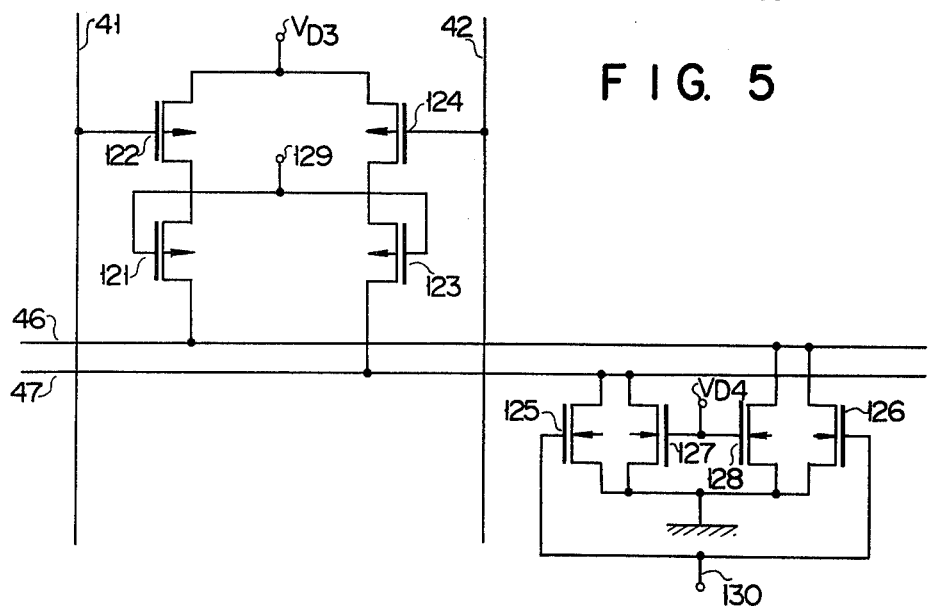

SEMICONDUCTOR MEMORY WITH DATA DETECTION CIRCUIT

This invention relates to a semiconductor memory device, and more particularly to a semiconductor memory device constituted by insulated gate field effect transistors.

Presently, as a semiconductor memory device a complementary memory based on the use of complementary static memory cells is used. In this type of semiconductor memory device, the high density-integration, and the shortening of the access time, of semiconductor elements constituting the device are a great problem.

Conventionally, in order to accomplish the high density-integration of semiconductor elements so-called silicon gate field effect transistors are favorably employed. This is because, in a semiconductor device using that silicon gate field effect transistor, a silicon polycrystalline layer subject to impurities diffusion can be advantageously used for wiring. In the conventional semiconductor memory device, however, since the conventional semiconductor memory device is so constructed that the data reading is effecting serially through a switching element composed of IG FET whose source electrode is not connected to the substrate and whose source potential is varied, a back gate bias effect is produced, when the data reading is carried out, in those IG FETs to delay the switching operation of the IG FET, thereby to greatly affect the access time.

The object of the invention is to provide a semiconductor memory device whose access time is shortened.

According to an embodiment of the invention there is provided a semiconductor memory device comprising a pair of data input lines, pair of data lines, memory cells disposed in the form of a matrix, the memory cells of each column being connected between the corresponding pair of data lines, a switching circuit provided for each column and having a first drive terminal for receiving a column selection signal and switching elements each connected between each of said pair of data lines in the corresponding column and the corresponding data input line, and turned on upon receipt of said column selection signal to connect each said pair of data lines to said pair of data input lines, respectively, and a data detection circuit provided for each column, having a second drive terminal for receiving said column selection signal, connected to at least one of said pair of data lines and adapted, upon receipt of said column selection signal, to provide a signal corresponding to a signal on said at least one data line.

This invention can be more fully understood from the following detailed description when taken in conjunction with the accompanying drawings in which:

FIGS. 2 and 3 show graphs illustrating the access time for each memory cell of the device shown in FIG. 1 together with that for an equivalent conventional device in the cases where aluminum gate type IG FETs and polycrystalline silicon gate type IG FETs are used, respectively; and FIGS. 4 to 7 each show a modified one of the data detection circuit used in the device shown in FIG. 1.

Figure 1:
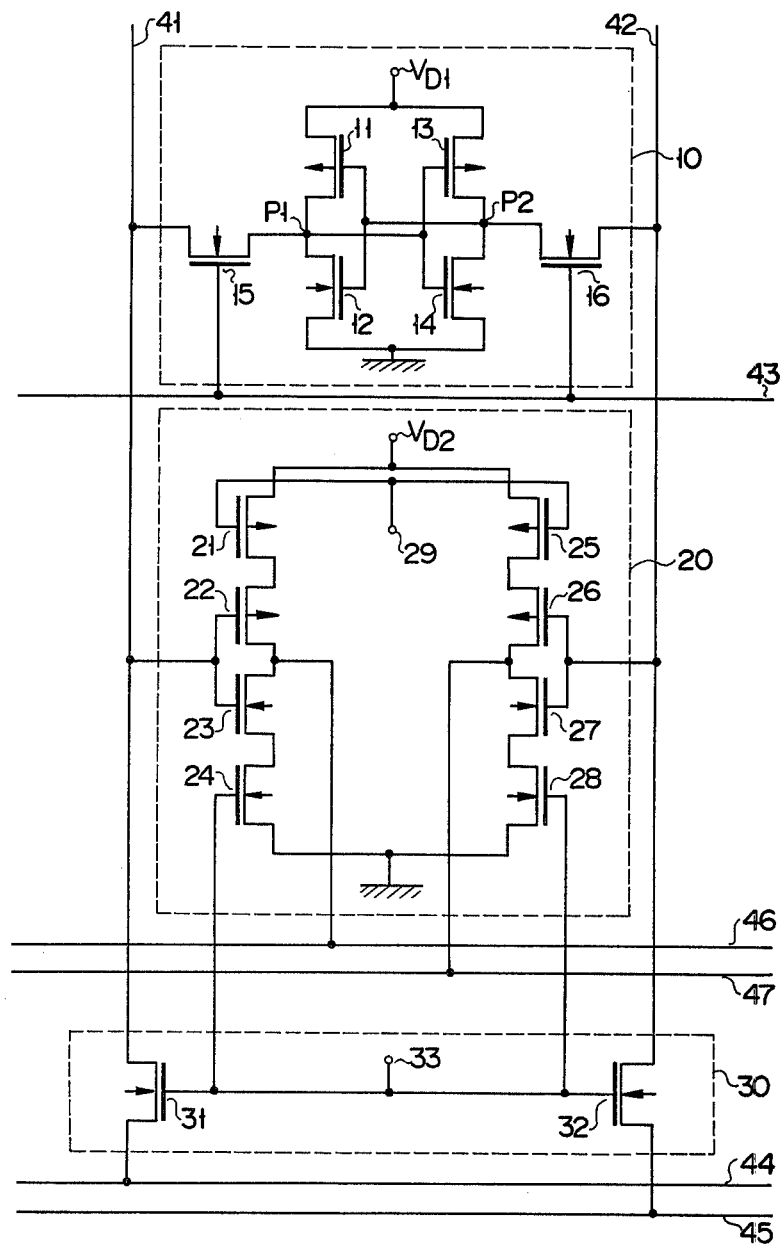
FIG. 1 is a circuit diagram showing part of a semiconductor memory device according to an embodiment of the invention.

FIG. 1 shows part of a semiconductor memory device having memory cells arranged in the form of a matrix and a data detection circuit disposed for each column. Though in FIG. 1, for a better understanding of the device, only one memory cell 10 is shown, memory cells similar to the memory cell 10 are actually disposed in a matrix form and a data detection circuit similar to that data detection circuit 20 is arranged for each column.

The memory cell 10 has a p channel type IG FET 11 and n channel type IG FET 12 connected in series between a power source terminal $V_{D1}$ and ground, and a p channel type IG FET 13 and n channel type IG FET 14 similarly connected in series therebetween. The connection point p1 between the IG FETs 11 and 12 is connected to respective gate electrodes of the IG FETs 13 and 14, and the connection point p2 between the IG FETs 13 and 14 is connected to respective gate electrodes of the IG FETs 11 and 12, thereby to constitute a flip-flop. The memory cell 10 further has an n channel type IG FET 15 connected between a data line 41 and the connection point p1 and an n channel type IG FET 16 connected between a data line 42 and the connection point p2. Respective gate electrodes of the IG FETs 15 and 16 are connected to a row selection line 43.

A switching circuit 30 has n channel type IG FETs 31 and 32 for connecting the data lines 41 and 42 to data input lines 44 and 45, respectively, and a drive terminal 33 for receiving a column selection signal S from a column selection circuit (not shown). Respective gate electrodes of the IG FETs 31 and 32 are connected to the drive terminal 33. The data input lines 44 and 45 are adapted to transmit a data signal and an inverted signal of this data signal from data source (not shown), respectively.

The data detection circuit 20 has p chhannel type IG FETs 21 and 22 and n channel type IG FETs, 23 and 24, connected in series between a power source terminal $V_{D2}$ and ground, and p channel type IG FETs 25 and 26 and n channel type IG FETs 27 and 28 connected in series between the power source terminal $V_{D2}$ and ground, and a drive terminal 29 for receiving an inverted signal $\overline{S}$ of a column selection signal from the column selection circuit. The drive terminal 29 is connected to respective gate electrodes of the IG FETs 21 and 25, and the gate electrodes of the IG FETs 24 and 28 are connected to the drive terminal 33. While respective gate electrodes of the IG FETs 22, 23 and respective gate electrodes of the IG FETs 26, 27 are connected to the data lines 41 and 42, respectively, the connection point between the IG FETs 22 and 23 and the connection point between the IG FETs 26 and 27 are connected to data output lines 46 and 47, respectively.

Hereinafter, the operation of the semiconductor memory device will be explained in accordance with the positive logic operation.

In the case writing information in the memory cell 10, a row selection line 43 is excited by a row selection circuit (not shown) and simultaneously the column selection signal S is applied from the column selection circuit (not shown) to the drive terminal 33. Upon receipt of this column selection signal, the IG FETs 31 and 32 are rendered conducting, so that data signals on the data input lines 44 and 45 are transmitted onto the data lines 41 and 42, respectively. The IG FETs 15 and 16 of the memory cell 10 are rendered conducting by the above excited row selection line 43. Assume now that a data signal on the data line 41 has a "1" level and a data signal on the data line 42 has a "0" level. Then, the "1" level signal on the data line 41 is applied to the respective gate electrodes of the IG FETs 13 and 14 through the conducting IG FET 15, thereby rendering the IG FET 14 conducting and the IG FET 13 nonconducting, while the "0" level signal on the data line 42 is applied to the respective gate electrodes of the IG FETs 11 and 12 through the conducting IG FET 16, thereby rendering the IG FET 11 conducting and the IG FET 12 nonconducting. Thus, the point p1 is kept at a "1" level, while the point p2 is kept at a "0" level.

During the above writing operation, a column selection signal is applied to the respective gate electrodes of the IG FETs 24 and 28 of the data detection circuit 20 through the drive terminal 33 of the switching circuit 30, thereby rendering the IG FETs 24 and 28 conducting, while an inverted signal of the column selection signal is applied to the respective gate electrodes of the IG FETs 21 and 25 through the drive terminal 29 of the detection circuit 20, thereby rendering the IG FETs 21 and 25 conducting. In the case where the signal on the data line 41 has a "1" level, the IG FET 22 is kept nonconducting and the IG FET 23 is rendered conducting. Simultaneously, upon receipt of the "0" level signal on the data line 42, the IG FET 26 is rendered conducting and the IG FET 27 is kept nonconducting. As a result, the inverted signals of the data signals on the data input lines 44 and 45 are transmitted onto the data output lines 46 and 47, respectively.

In the case of reading information from the memory cell 10, as in the case of the writing operation, the row selection line 43 is excited, and simultaneously a column selection signal and an inverted signal of the column selection signal are applied to the drive terminals 33 and 29, respectively. As a result, the data signal from the point p1 of the memory cell 10 which has a logical level of, for example, "1" is applied to the gate electrode of the IG FET 23 through the IG FET 15 and data line 41 to render the IG FET 23 conducting, and simultaneously the data signal from the point p2 which has a logical level of "0" is applied to the gate electrode of the IG FET 26 through the IG FET 16 and data line 42 to render the IG FET 26 conducting. Thus, a "0" level signal and a "1" level signal are transmitted onto the data output lines 46 and 47, respectively.

Since, according to this invention, the data signal read from the memory cell is transmitted without being passed serially through an IG FET, it is free from a back gate bias effect unlike the conventional case, so that access time is decreased largely.

Figure 3:
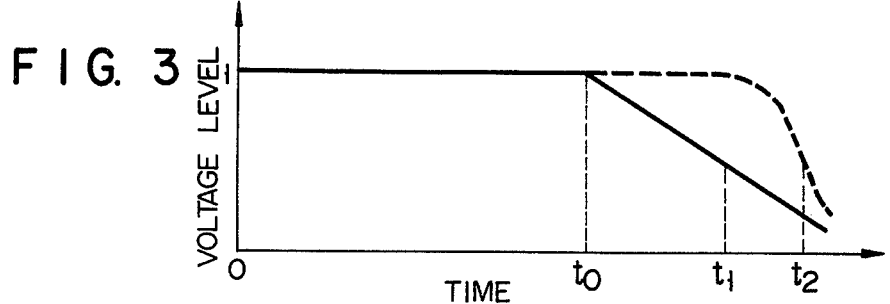

FIGS. 2 and 3 show by solid lines, the variations in voltages on the data lines in reading a "0" level signal from the memory cell 10 in the case of constructing the semiconductor memory device shown in FIG. 1 by using IG FETs each having an aluminium gate and those each having a monocrystalline gate respectively. The broken lines indicate the variations in voltages on the data lines of a conventional equivalent semiconductor memory device. At the points of time when the information-reading and -writing cycles commence respectively, the data lines 41 and 42 are compulsively so excited as to have a "1" level signal. Therefore, in the case where a data signal having a "0" level is read from the memory cell 10, some length of time is required by the point of time when the detection circuit 20 reads this data signal as a "0" level data signal, namely by the point of time when the "1" level signal on the data line is reduced to a specified level.

In the case of using IG FETs having an aluminum gate in the device according to the invention as shown in FIG. 2, at a point of time t0 after completion of the address designating operation, the "0" level data signal from the memory cell 10 is connected to the data line, and the signal level on this data line gradually decreases and at a point of time t1 the detection circuit 20 reads the signal on that data line as a data signal having a logical level of "0". Conventionally, much time was required from the start of the address designating operation until the content of the memory cell was coupled to a data detection circuit and at a point of time t2 the content of the memory cell was read by the detection circuit. When comparing a conventional semiconductor memory device having an access time of, for example, 1 microsecond with the equivalent semiconductor device according to the invention, the access time of the latter device was shortened by about 300 nanoseconds.

Also in the case of using IG FETs having a polycrystalline silicon gate, the access time t1 of the present device is made largely shorter than the access time t2 of the conventional one.

FIGS. 4 to 7 show respectively modified ones of the data detection circuit of the semiconductor memory device shown in FIG. 1.

The data detection circuit shown in FIG. 4 includes p channel type IG FETs 121 and 122 connected in series between a power source terminal $V_{D3}$ and a data output line 64, and p channel type IG FETs 123 and 124 connected in series between the power source terminal $V_{D3}$ and a data output line 47. Respective gate electrodes of the IG FETs 121 and 123 are connected to a drive terminal 129 for receiving a column selection signal S, while respective gate electrodes of the IG FETs 122 and 124 are connected to the data lines 41 and 42, respectively. The data detection circuit further includes n channel type IG FETs 125 and 126 respectively provided between the data output lines 46, 47 and ground so as to maintain the data output lines 46 and 47 usually at a logical level of "0". Respective gate electrodes of the IG FETs 125 and 126 are applied with an inverted signal $\overline{C}$ of a chip selection signal C through a drive terminal 130 and, during a period in which the chip selecting operation is not performed, the IG FETs 125 and 126 are rendered conducting thereby to set the potential of the data output lines 46, 47 at a logical level of "0". Connected in parallel to the IG FETs 125 and 126 are n channel type IG FETs 127 and 128 having a small mutual conductance, respectively. The IG FETs 127 and 128 are applied with a voltage through a terminal $V_{D4}$ at their respective gate electrodes and rendered always conducting to compensate that portion of the charge in the data output lines 46 and 47 which has leaked during the column selecting operation.

When an inverted signal $\overline{S}$ of the column selection signal S is applied to the drive terminal 129, the IG FETs 121 and 123 are rendered conducting. Where, under this condition, for example, "1" and "0" level data signals appear on the data lines 41 and 42, respectively, the IG FET 122 is not rendered conducting and accordingly the signal on the data output line 46 remains at a "0" level. On the other hand, the IG FET 124 is rendered conducting upon receipt of the "0" level signal on the data line 42, so that the signal level on the data output line 47 is altered to a "1" level by the power source terminal $V_{D3}$. Thus, the "1" and "0" level data signals on the data lines 41 and 42 are read on the data output lines 46 and 47 as "0" and "1" level data signals, respectively.

The data detection circuit shown in FIG. 4 is constituted by the elements fewer in number than those constituting the data detection circuit of FIG. 1. Namely, in the data detection circuit of FIG. 1, an $n \times 8$ number of elements are required for the memory cells arranged in the form of a matrix having n columns, whereas in the data detection circuit of FIG. 4 only an $(n \times 4 + 4)$ number of elements are required for the memory cells arranged in the n-column matrix.

The circuit shown in FIG. 5 which is constructed by making the interchanges between the IG FETs 121 and 123 and between the IG FETs 121 and 123 and between the IG FETs 122 and 124, of the data detection circuit shown in FIG. 4 performs the same function as in the case of the data detection circuit of FIG. 4.

Figure 6:
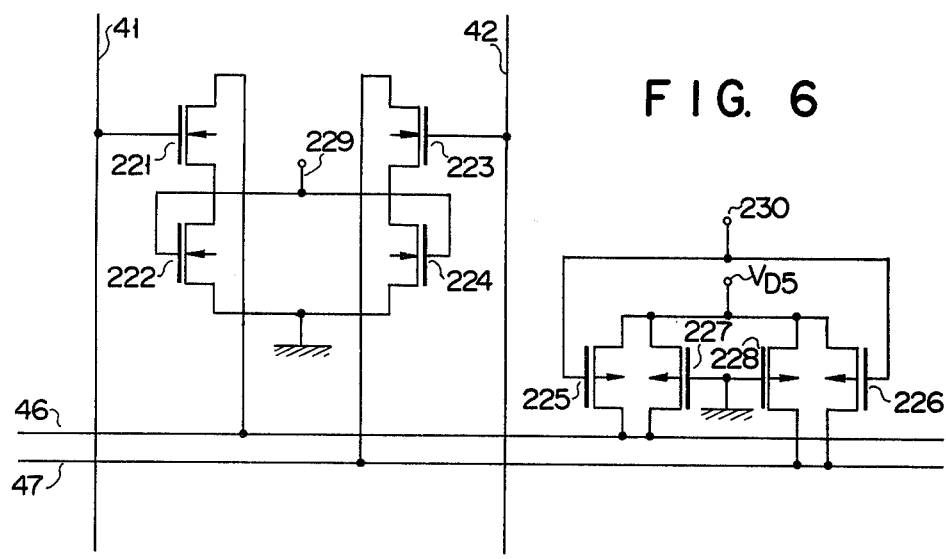
Figure 7:
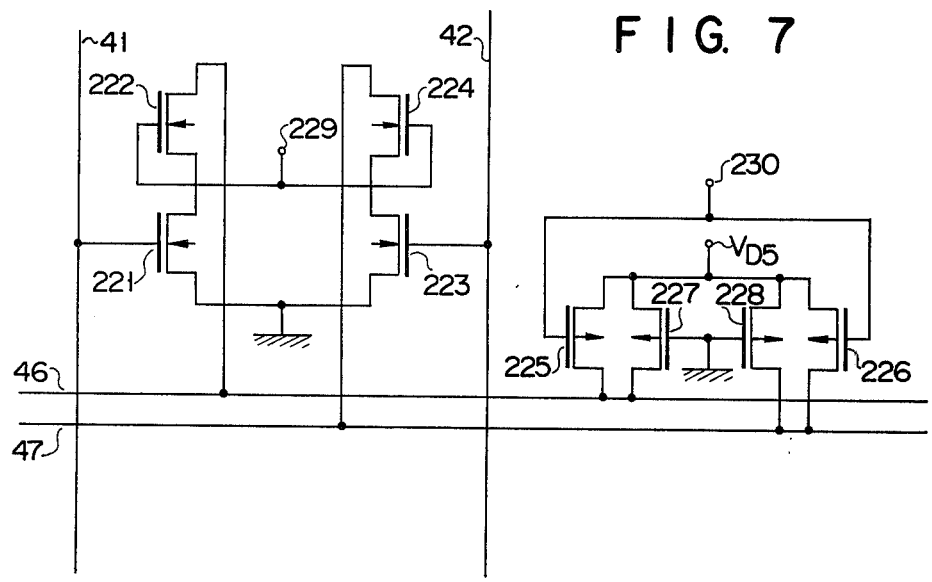

Note that in the data detection circuit of FIG. 4 the data output line is kept at a "0" level, whereas the data detection circuit of FIG. 6 is so constructed that the data output line is so excited as to normally have a potential of "1" level. In FIG. 6, n channel type IG FETs 221 and 222 and n channel type IG FETs 223 and 224 are connected in series between the data output lines 46, 47 and ground, respectively. Respective gate electrode of IG FETs 221 and 223 are connected to the data lines 41 and 42, respectively, and respective gate electrodes of IG FETs 222 and 224 are connected to a drive terminal 229 for receiving a column selection signal. The data detection circuit shown in FIG. 6 further includes p channel type IG FETs 225 and 226 respectively connected between a power source terminal $V_{D5}$ and the data output lines 46, 47. Respective gate electrodes of the IG FETs 225 and 226 are applied with a chip selection signal C through a drive terminal 230, and during a period in which the chip selecting operation is not carried out the IG FETs 225 and 226 are rendered conducting, so that the data output lines 46 and 47 are so excited through the power source terminal $V_{D5}$ as to have a potential of "1" level. Connected in parallel to the IG FETs 225 and 226 are p channel type IG FETs 227 and 228 having a small mutual conductance, respectively. The IG FETs 227 and 228 have their respective gate electrodes kept at a ground potential and are rendered always conducting to compensate that portion of the charge in the data output lines 46 and 47 which has leaked during the chip selecting operation.

The data detection circuit shown in FIG. 6 operates in accordance with the same principle, and has the same function and effect, as in the case of the circuit shown in FIG. 4. Further, the data detection circuit shown in FIG. 7 which is constructed by making the interchanges between the IG FETs 221 and 223 and between the IG FETs 222 and 224, of the data detection circuit of FIG. 6 functions in the same manner as in the case of the circuit of FIG. 6.

This invention has above been explained by describing one embodiment, but is not limited thereto. For instance, with regard to the data detection circuit shown in FIGS. 1 and 4 to 7, it is possible to omit the IG FETs connected to one of the data lines 41 and 42, for example, the IG FETs 25, 26, 27 and 28, and omit the corresponding output line, for example, the data output line 47. Further, with regard to the data detection circuits shown in FIGS. 4 to 7, the IG FETs 127, 128, 227 and 228 having a small mutual conductance may be omitted. Further, the drive terminal 229 shown in FIGS. 6 and 7 may be connected to the drive terminals 33 of the switching circuit 30 shown in FIG. 1. Further, in FIG. 1, it is possible to perform the respective interchanges between the IG FETs 21, 24, 25 and 28 and the IG FETs 22, 23, 26 and 27.

What we claim is:

1. A semiconductor memory device comprising a pair of data input lines; at least one pair of data lines associated with said pair of input lines; memory cells disposed in the form of a matrix having columns, the memory cells of each column being connected between a corresponding pair of said data lines; a first data output line; a data detection circuit including a first series circuit comprising first and second switching elements provided for each column and each said first series circuit being connected between a first-voltage receiving terminal for receiving a first specified voltage and said data output line, said first switching element for each column being responsive to a column selection signal for said column and said second switching element for each column having a control terminal connected to one data line of said pair of data lines for said column, and a third switching element commonly provided for said memory cells and connected between said data output line and a second voltage receiving terminal for receiving a second specified voltage lower than said first specified voltage.

2. A semiconductor memory device according to claim 1, wherein said third switching element is operated in response to a chip selection signal to de-couple said data output line from said second voltage receiving terminal.

3. A semiconductor memory device according to claim 1, which further comprises a second data output line and in which said data detection circuit further includes a second series circuit of fourth and fifth switching elements provided for each column and connected between said first-voltage receiving terminal and said second data output line, said fourth switching element for each column being responsive to said column selection signal for said column and said fifth switching element for each column having a control terminal connected to the other data line of said pair of data lines for each column, and a sixth switching element commonly provided for said memory cells and connected between said second data output line and said second-voltage receiving terminal.

4. A semiconductor memory device according to claim 1, wherein said data detection circuit further includes a high resistance element connected in parallel to said third switching element.

5. A semiconductor memory device according to claim 4, wherein said high resistance element is constituted by a field effect transistor having a small mutual conductance.

6. A semiconductor memory device according to claim 1, wherein said first and second switching elements are each constituted by a p channel type field effect transistor, and said third switching element is constituted by an n channel type field effect transistor.

7. A semiconductor memory device comprising a pair of data input lines; at least one pair of data lines associated with said pair of input lines; memory cells disposed in the form of a matrix having columns, the memory cells of each column being connected between a corresponding pair of said data lines; a first data output line; a data detection circuit including a first series circuit comprising first and second switching elements provided for each column and each said first series circuit connected between a first-voltage receiving terminal for receiving a first specified voltage and said data output line, said first switching element for each column being responsive to a column selection signal for said column and said second switching element for each column having a control terminal connected to one data line of said pair of data lines for said column, and a third switching element commonly provided for said memory cells and connected between said data output line and a second voltage receiving terminal for receiving a second specified voltage higher than said first specified voltage.

8. A semiconductor memory device according to claim 7, wherein said third switching element is operated in response to a chip selection signal to de-couple said data output line from said second voltage receiving terminal.

9. A semiconductor memory device according to claim 7, which further comprises a second data output line and in which said data detection circuit further includes a second series circuit of fourth and fifth switching elements provided for each column and connected between said first-voltage receiving terminal and said second data output line, said fourth switching element being responsive to said column selection signal and said fifth switching element having a control terminal connected to the other of said pair of data lines, and a sixth switching element commonly provided for said memory cells and connected between said second data output line and said second-voltage receiving terminal.

10. A semiconductor memory device according to claim 7, wherein said data detection circuit further includes a high resistance element connected in parallel to said third switching element.

11. A semiconductor memory device according to claim 10, wherein said high resistance element is constituted by a field effect transistor having an small mutual conductance.

12. A semiconductor memory device according to claim 7, wherein said first and second switching elements are each constituted by an n channel type field effect transistor, and said third switching element is constituted by a p channel type field effect transistor.

* * * * *